(12) United States Patent
Koh

(10) Patent No.: US 7,368,345 B2
(45) Date of Patent: May 6, 2008

(54) FLASH MEMORY DEVICES AND METHODS OF FABRICATING THE SAME

(75) Inventor: Kwan Ju Koh, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 332 days.

(21) Appl. No.: 10/960,377

(22) Filed: Oct. 6, 2004

(65) Prior Publication Data

US 2005/0116279 A1   Jun. 2, 2005

(30) Foreign Application Priority Data

Oct. 6, 2003   (KR) .................. 10-2003-0069304

(51) Int. Cl.
    *H01L 21/336* (2006.01)
(52) U.S. Cl. .............. 438/257; 438/429; 438/360
(58) Field of Classification Search ............ 438/211,
    438/201, 257, 588–589, 593, 585, 213, 221–222,
    438/429, 360, FOR. 203
    See application file for complete search history.

(56) References Cited

U.S. PATENT DOCUMENTS 4,764,480 A  *  8/1988   Vora ......................... 438/203
5,567,635 A  *  10/1996  Acovic et al. ............ 438/259
6,084,265 A      7/2000   Wu
6,583,466 B2     6/2003   Lin et al.
6,587,396 B1     7/2003   Jang
7,037,785 B2 *   5/2006   Dong et al. ............... 438/259
7,154,144 B2 *  12/2006   Kim et al. ................ 257/328

* cited by examiner

*Primary Examiner*—Zandra V. Smith
*Assistant Examiner*—Thanh Y. Tran
(74) *Attorney, Agent, or Firm*—Saliwanchik, Lloyd & Saliwanchik

(57) ABSTRACT

Flash memory devices and methods of fabricating the same are disclosed. A disclosed method comprises doping at least one active region of a substrate, and forming an etching mask layer on the active region. The etching mask layer defines an opening exposing a portion of the active region. The disclosed method further comprises forming an etching groove in the active region. The etching groove separates a source region and a drain region. The disclosed method also comprises growing an epitaxial layer within the etching groove; forming a gate insulating layer on the epitaxial layer; depositing a first polysilicon layer on inner sidewalls of the opening and on the gate insulating layer; forming a dielectric layer on the first polysilicon layer; and depositing a second polysilicon layer on the dielectric layer.

7 Claims, 4 Drawing Sheets

FLASH MEMORY DEVICES AND METHODS OF FABRICATING THE SAME

FIELD OF THE DISCLOSURE

The present disclosure relates to flash memory and, more particularly, to flash memory devices and methods of fabricating the same.

BACKGROUND

Generally, semiconductor memory devices are divided into volatile memories and nonvolatile memories. The volatile memories, including chiefly random access memories (RAM) such as dynamic random access memories (DRAM) and static random access memories (SRAM), retain their memory data when the power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structures are widely applied to flash EEPROM. On the other hand, the memory devices of the MIS family perform memory functions by using traps positioned on a dielectric bulk, the interface between dielectrics, and the interface between the dielectric and the semiconductor. At present, the MONOS (metal oxide nitride oxide semiconductor)/SONOS (semiconductor oxide nitride oxide semiconductor) structure is chiefly being employed for flash EEPROM.

Jang, U.S. Pat. No. 6,587,396, describes a horizontal surrounding gate (HSG) flash memory cell. In the Jang Patent, the HSG flash memory cell is located on a trench of an isolation region, and a channel region thereof composed of a semiconductor film is sequentially encompassed by a tunneling oxide layer, a floating gate, and a control gate. The floating gate and the control gate are also formed on the trench below the channel region.

Lin et al., U.S. Pat. No. 6,583,466, describes a vertical split gate flash memory device in an orthogonal array of rows and columns with devices in columns having shared source regions. The Lin et al. Patent includes forming FET cells in rows and columns with the rows orthogonally arranged relative to the columns, forming FOX regions between the rows, forming a set of trenches with sidewalls and a bottom in a semiconductor substrate with threshold implant regions formed in the sidewalls, forming doped drain regions near the surface of the substrate, forming doped source regions in the base of the device below the trenches, forming a tunnel oxide layer over the substrate including the trenches, and sequentially forming floating gates, an interelectrode dielectric layer, control gate electrodes, and spacers.

Wu, U.S. Pat. No. 6,084,265, describes a high density, shallow trench, contactless nonvolatile memory. The Wu Patent includes forming a plurality of field oxides on a semiconductor substrate, forming buried bit lines in the semiconductor substrate and beneath the field oxides, forming trenched floating gates between the field oxides over the buried bit lines in the semiconductor substrate, forming tunnel dielectrics between the trenched floating gates and the semiconductor substrate, forming an interpoly dielectric over the field oxides and the trenched floating gates, and forming control gates on the interpoly dielectric.

In conventional flash memory devices, impurities in a source/drain region may be diffused into a channel area. Such diffusion shortens the channel length, thereby causing a short channel effect and deteriorating the device characteristics. In addition, the low capacitance due to small surface areas of the floating gate and the control gate results in a low coupling ratio. Therefore, it is difficult to effectively inject or remove charges in the floating gate. As used herein, the coupling ratio is a ratio of a voltage applied to the floating gate to a voltage applied to the control gate. Due to these problems, conventional flash memory devices may not smoothly perform program and erase functions.

DETAILED DESCRIPTION

Figure 1:
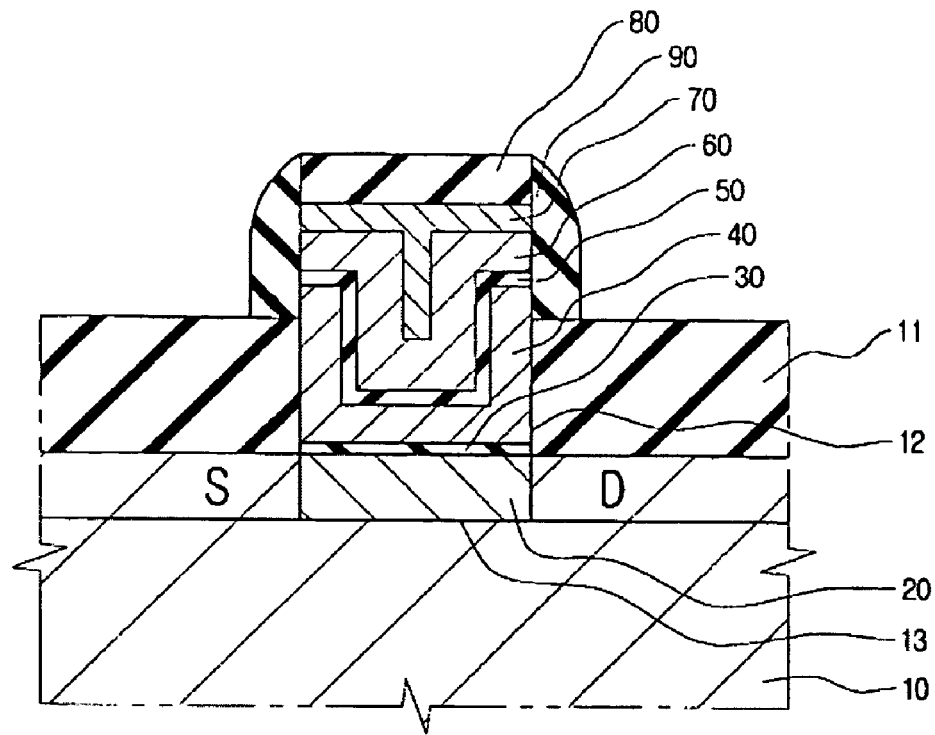
FIG. 1 is a cross-sectional view of an example flash memory device constructed in accordance with the teachings of the present invention.

FIG. 1 is a cross-sectional view of an example flash memory device. Referring to FIG. 1, a source (S)/drain (D) region is formed in a silicon substrate 10. In the illustrated example, the source region (S) is positioned a predetermined distance away from the drain region (D). A dielectric layer 11 is formed over the source/drain regions. The dielectric layer 11 has an opening that exposes a portion of the silicon substrate 10 between the source region (S) and the drain region (D). An etching groove 13 is formed within the opening in the silicon substrate 10. An epitaxial layer 20 is grown in the etching groove 13. The epitaxial layer 20 is used as a channel layer. A gate insulating layer 30 is formed on the epitaxial layer 20. Next, a floating gate 40 having a substantially uniform thickness is formed along the top surface of the gate insulating layer 30 and along the inner sidewalls of the opening of the dielectric layer 11. A flash insulator layer 50 is deposited on the floating gate 40. A control gate 60 is formed on the flash insulator layer 50. A silicide layer 70 is formed on the control gate 60. A capping layer 80 is deposited on the silicide layer 70. Next, spacers 90 are formed on the sidewalls of the capping layer 80, the silicide layer 70, the control gate 60, the flash insulator layer 50 and the upper portions of the floating gate 40.

In the illustrated example, the dielectric layer 11 preferably comprises a single oxide layer or a multi-layer including at least one oxide layer and at least one nitride layer. The epitaxial layer 20 is preferably a single crystal silicon layer grown by an epitaxial process. The gate insulating layer 30 preferably comprises a thermal oxide layer grown by a thermal oxidation process. The floating gate 40 and the control gate 60 are preferably high concentration polysilicon layers. The flash insulator layer 50 is preferably a multi-layered insulating layer with a high dielectric constant, (e.g., an oxide-nitride-oxide (ONO)). The silicide layer 70 preferably comprises high fusion point metal such as Ti, Ta, Co, etc. The capping layer 80 is preferably an oxide layer which is used as a protective layer.

The illustrated flash memory device comprises at least one conductive wiring (not shown) which is electrically connected with the source/drain region through a contact hole (not shown) in the etching mask layer 11. In addition, the silicon substrate 10 may be a first conduction type and the source/drain region may be a second conduction type. The first conduction type may be a P-type and the second conduction type may be an N-type. Alternatively, the first conduction type may be an N-type and the second conduction type may be a P-type.

In the example flash memory device illustrated in FIG. 1, because the epitaxial layer 20 is formed as a channel area within the etching groove 13, impurities in the source/drain regions cannot be diffused into the channel area 20. As a result, the shortening of the channel area length due to diffusion of impurities from the source/drain regions to the channel area is prevented and, therefore, the leakage current of the channel area is reduced.

In addition, the floating gate 40 is formed along the inner sidewalls of the opening of the dielectric layer 11 and along the top surface of the gate insulating layer 30. The flash insulator layer 50 and the control gate 60 are then sequentially deposited along the top surface of the floating gate 40. Thus, the effective area of the capacitor formed by the floating gate 40 and the control gate 60 is larger than the effective area of a capacitor formed by a floating gate and a control gate formed on a plane. This enlargement of the effective area increases the coupling ratio.

Figure 2A:
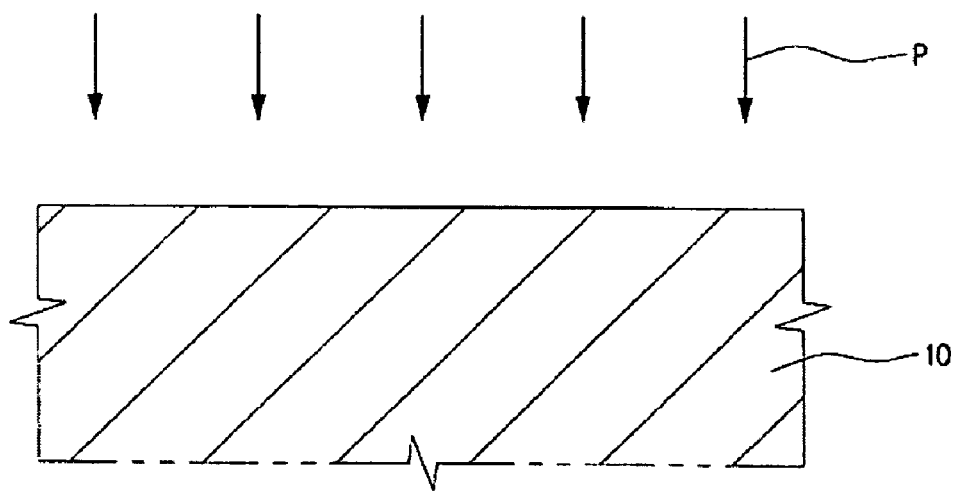
FIGS. 2a through 2g are cross-sectional views illustrating an example process of fabricating a flash memory device performed in accordance with the teachings of the present invention.

An example method of fabricating the flash memory device of FIG. 1 is now described with reference to FIG. 2a through FIG. 2g. Referring to FIG. 2a, at least one device isolation structure (not shown) is formed within at least one field region (not shown) of a semiconductor substrate (e.g., a silicon substrate 10), by using a shallow trench isolation (STI) process or a local oxidation of silicon (LOCOS) process. As a result, at least one active region is defined in the silicon substrate 10. The silicon substrate 10 is preferably a first conduction type, for example, P-type single crystal silicon. Alternatively, the silicon substrate 10 may be a second conduction type, for example, an N-type silicon substrate. The illustrated example uses the P-type silicon substrate.

Figure 2B:
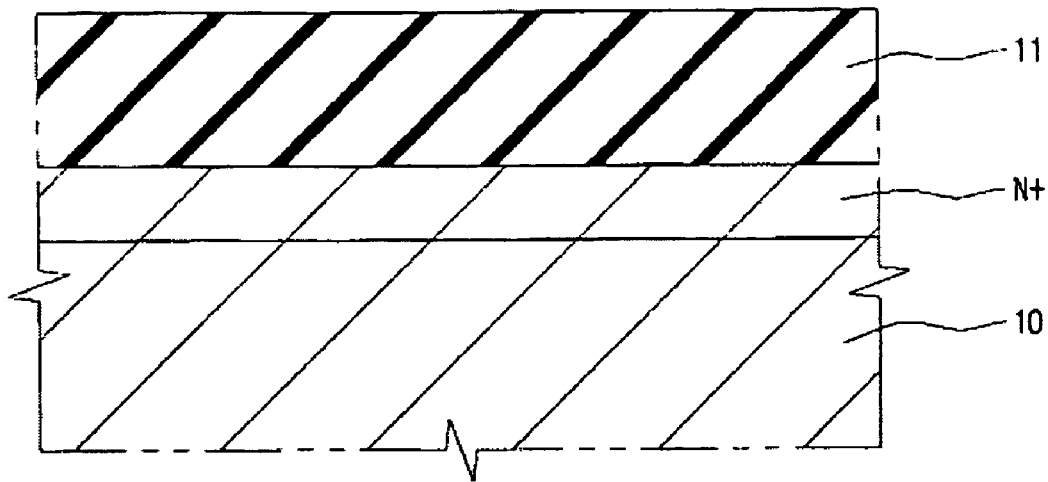

Referring to FIG. 2b, the active region of the silicon substrate 10 is doped with impurities to form a source/drain region. More specifically, high concentration N-type impurities, (for example, phosphorus ions), are implanted into the active region of the silicon substrate 10 by using an ion implantation process. The implanted impurities are then diffused by a heat treatment process to form an N+-type area. The depth of the N+-type area is equal to the junction depth of the source/drain region. Subsequently, an insulating layer 11 such as oxide is deposited on the silicon substrate 10 by a chemical vapor deposition process. The insulating layer 11 preferably has a thickness between about 5000 Å and about 10000 Å. The insulating layer 11 may be, for example, a single oxide layer or a multi-layer comprising at least one oxide layer and at least one nitride layer.

Figure 2C:
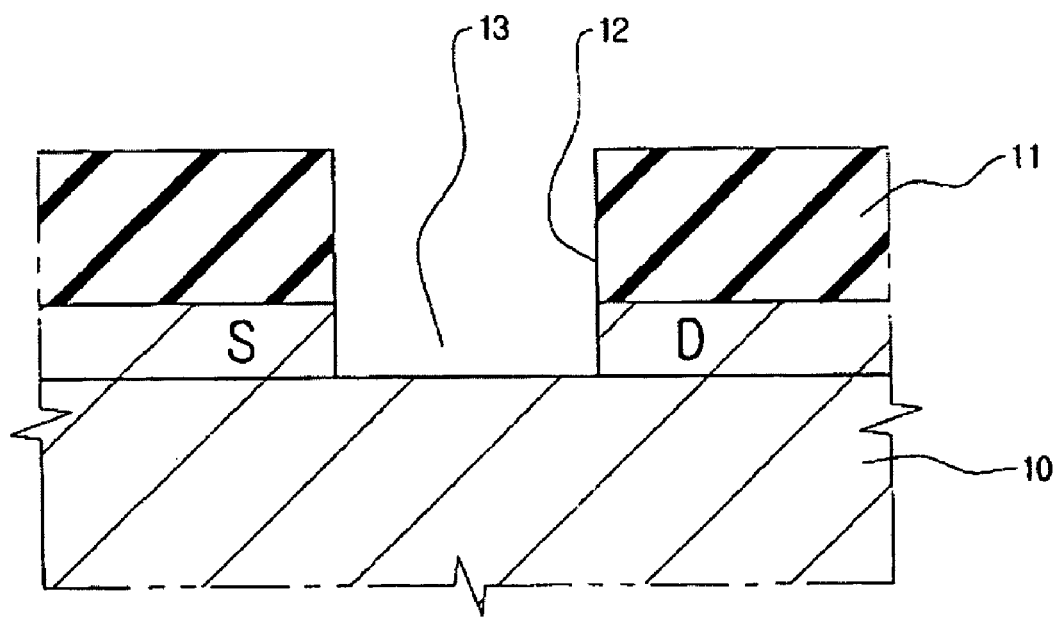

Referring to FIG. 2c, a photoresist pattern (not shown) is formed over the insulating layer 11. A portion of the insulating layer 11 is removed by using the photoresist pattern as an etching mask to form an etching mask layer 11 with an opening. The opening of the etching mask layer 11 exposes a portion of the silicon substrate 10 on which a channel area is formed. The photoresist pattern is then removed. The exposed area of the silicon substrate 10 is then etched by using the etching mask layer 11 as a mask. In the illustrated example, the exposed area of silicon substrate 10 is etched more deeply than the junction depth of the N+-type area. As a result, an etching groove 13 is formed in the channel area of the silicon substrate 10 between the source region (S) and the drain region (D).

Figure 2D:
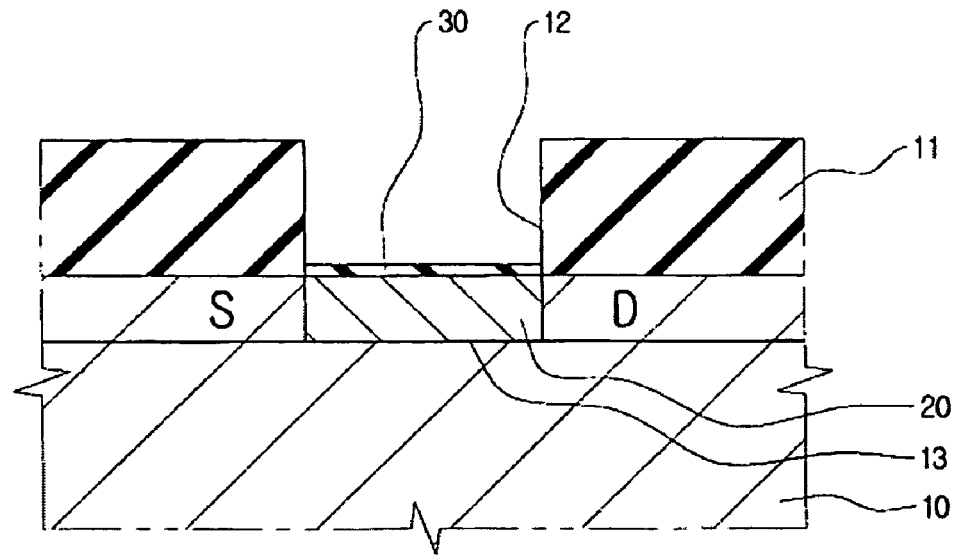

Referring to FIG. 2d, an epitaxial layer 20 is grown on the top surface of the etching groove 13 by an epitaxial process. The epitaxial layer 20 is preferably made of single crystal silicon and used as a channel layer. The epitaxial layer 20 is preferably of the same conduction type as the silicon substrate 10 (e.g., P-type) and preferably has a similar or equal doping concentration to that of the silicon substrate 10. Next, a gate insulating layer 30 is formed on the epitaxial layer 20. The gate insulating layer 30 is preferably formed by a thermal oxidation process and has a thickness less than about 100 Å.

Figure 2E:
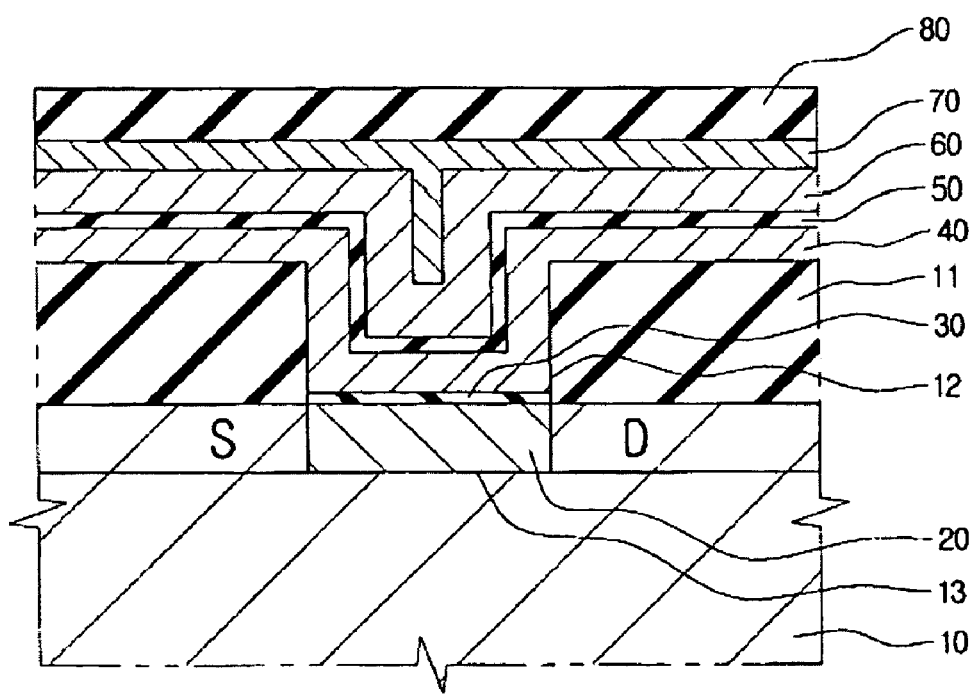

Referring to FIG. 2e, a CVD process such as low pressure chemical vapor deposition (LPCVD) is performed on the structure of FIG. 2d to deposit a first polysilicon layer 40 for a floating gate. The first polysilicon layer 40 has a substantially uniform thickness and is formed on the surface of the etching mask layer 11 and on the surface of the gate insulating layer 30. In other words, the first polysilicon layer 40 does not completely fill the opening 12 of the etching mask layer 11, but is instead deposited along the top surface of the etching mask layer 11, the inner sidewalls of the opening 12, and the top surface of the gate insulating layer 30. As a result, the top surface area of the portion of the floating gate layer 40 within the channel area is larger in comparison to that of a conventional floating gate formed in a horizontal plane on a silicon substrate.

Next, a dielectric layer 50, (for example, an oxide-nitride-oxide layer with a high dielectric constant), is formed on the first polysilicon layer 40. In the illustrated example, the dielectric layer 50 does not completely fill the opening between the sidewalls of the opening of the etching mask layer 11/floating gate layer 40. Instead, the dielectric layer 50 is deposited with a substantially uniform thickness along the top surface of the first polysilicon layer 40. This dielectric layer structure expands the bottom surface area of a control gate to be formed later compared to a conventional control gate formed in a horizontal plane on a silicon substrate.

A second polysilicon layer 60 is then formed on the dielectric layer 50 by using a CVD process such as LPCVD. The second polysilicon layer, which is used to form a control gate, fills a substantially vertical opening defined by the dielectric layer 50.

A metal layer including, for example, Ti, Ta, or Co is deposited on the second polysilicon layer 60; preferably by a sputtering process. A heat treatment process is performed on the metal layer to form a silicide layer 70 on the second polysilicon layer 60.

A capping layer 80 is then deposited on the silicide layer 70 by using a CVD process. The capping layer 80 is preferably an oxide layer which is used as a protective layer to shelter the silicide layer 70 from damage during a later etching process.

Figure 2F:
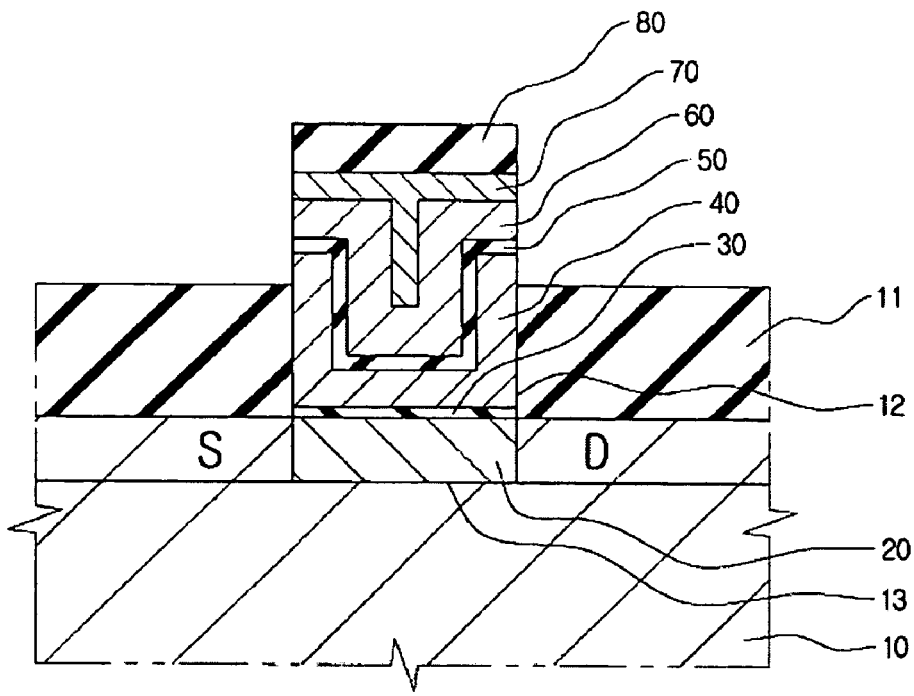

Referring to FIG. 2f, a gate structure pattern (not shown) is formed by performing a photolithography process on the structure of FIG. 2e. An etching process is then performed using the gate structure pattern as an etching mask. As a result, a structure comprising the capping layer 80, the silicide layer 70, the control gate 60, the dielectric layer 50, and the floating gate 40 is formed within the channel area as shown in FIG. 2*f.*

Figure 2G:
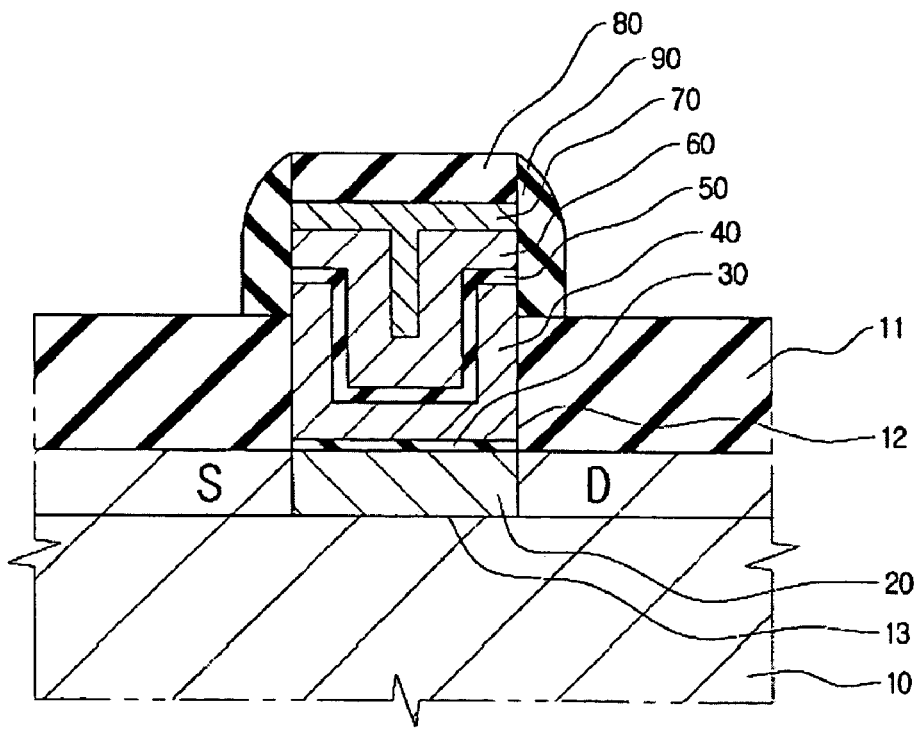

Referring to FIG. 2*g,* an insulating layer, (for example, a nitride layer), is deposited over the structure of FIG. 2*f.* The nitride layer is then etched by an anisotropic etching process such as an etch back process to form spacers 90 on the sidewalls of the capping layer 80, the silicide layer 70, the control gate 60, the dielectric layer 50, and the floating gate 40.

Subsequently, at least one contact hole (not shown) is formed through the etching mask layer 11 and conductive wiring (not shown) is formed over the etching mask layer 11. The conductive wiring is electrically connected with the source/drain region(s) through the contact hole(s). Thus, the flash memory device is completed.

From the foregoing, persons of ordinary skill in the art will appreciate that, by forming the floating gate 40, the dielectric layer 50, and the control gate 60 along the sidewalls of the opening 12 defined in the etching mask layer 11 and along the top surface of the gate insulating layer 30, the disclosed methods expand the surface areas of the floating gate 40 and the control gate 60, which are in contact with the dielectric layer, thereby increasing the capacitance of the capacitor defined by the effective areas of the floating gate 40 and the control gate 60. As a result, the disclosed flash memory devices and methods achieve a high coupling ratio and better program and erase operations. In addition, by forming the etching groove 13 in the channel area and growing the epitaxial layer 20 as the channel area within the etching groove 13, the disclosed methods prevent the impurities of the source/drain regions from being diffused into the channel area, thereby reducing the leakage current of the flash memory device.

From the foregoing, persons of ordinary skill in the art will further appreciate that flash memory devices and methods of manufacturing flash memory devices have been disclosed which prevent the short channel effect by ensuring impurities are not diffused into a channel region. Further the disclosed methods and devices achieve an increased coupling ratio.

It is noted that this patent claims priority from Korean Patent Application Serial Number 10-2003-0069304, which was filed on Oct. 6, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a flash memory device comprising:
   doping at least one active region of a substrate;
   forming an etching mask layer on the active region, the etching mask layer defining an opening exposing a portion of the active region;
   forming an etching groove in the exposed portion of the active region, the etching groove separating a source region and a drain region;
   growing an epitaxial layer within the etching groove;
   forming a gate insulating layer within the opening, the gate insulating layer being formed on the epitaxial layer;
   depositing a first polysilicon layer on inner sidewalls of the opening and on the gate insulating layer;
   forming a dielectric layer on the first polysilicon layer; and
   depositing a second polysilicon layer on the dielectric layer.

2. A method as defined by claim 1, wherein the etching mask layer is a single layer of oxide or a multi-layer of oxide and nitride.

3. A method of fabricating a flash memory device comprising:
   depositing an insulating layer on a substrate
   forming an etching mask layer defining an opening by removing a portion of the insulating layer;
   forming an etching groove in an active region of the substrate exposed by the opening to define a source region and a drain region;
   forming a channel layer comprising an epitaxial layer within the etching groove;
   forming a gate insulating layer on the epitaxial layer;
   forming a floating gate on a bottom and inner sidewalls of the opening;
   forming a dielectric layer on the floating gate; and
   forming a control gate on the dielectric layer.

4. A method as defined by claim 3, wherein the dielectric layer defines a dielectric opening, and forming the control gate comprises filling the dielectric opening with the control gate.

5. A method as defined in claim 4, wherein the dielectric opening is a generally vertical opening.

6. A method as defined in claim 5, wherein the control gate has a T-shaped cross-section.

7. A method as defined in claim 3, wherein the floating gate extends above the etching mask layer.

\* \* \* \* \*